US012583798B2

(12) United States Patent (10) Patent No.: US 12,583,798 B2

Holowczak (45) Date of Patent: Mar. 24, 2026

(54) ATOMIC LAYER DEPOSITION METHOD ENHANCING THE NUCLEATION AND CRYSTALLINITY OF A BORON NITRIDE INTERFACE COATING ON A SILICON CARBIDE FIBER

(71) Applicant: Raytheon Technologies Corporation, Farmington, CT (US)

(72) Inventor: John E. Holowczak, South Windsor, CT (US)

(73) Assignee: RTX Corporation, Farmington, CT (US)

( * ) Notice: Subject to any disclaimer, the term of this patent is extended or adjusted under 35 U.S.C. 154(b) by 559 days.

(21) Appl. No.: 18/108,929

(22) Filed: Feb. 13, 2023

(65) Prior Publication Data

US 2024/0270652 A1 Aug. 15, 2024

(51) Int. Cl.

| *C23C 16/455* | (2006.01) |
| *C04B 35/622* | (2006.01) |
| *C04B 35/628* | (2006.01) |
| *C04B 41/45* | (2006.01) |

(52) U.S. Cl.
CPC .. *C04B 35/62281* (2013.01); *C04B 35/62868* (2013.01); *C04B 35/62876* (2013.01); *C04B 41/4578* (2013.01); *C23C 16/45525* (2013.01); *C04B 2235/386* (2013.01); *C04B 2235/408* (2013.01); *C04B 2235/5244* (2013.01); *C04B 2235/614* (2013.01); *C04B 2235/76* (2013.01)

(58) Field of Classification Search
CPC ................................................. C23C 16/45525
See application file for complete search history.

(56) References Cited

U.S. PATENT DOCUMENTS

| 10,658,472 | B2 | 5/2020 | Berry et al. |
| 2017/0342844 | A1 | 11/2017 | Schmidt et al. |
| 2019/0062913 | A1* | 2/2019 | She ...................... C23C 16/045 |
| 2022/0178262 | A1* | 6/2022 | Sudre ................ C04B 35/62897 |

OTHER PUBLICATIONS

Extended European Search Report for EP Application No. 24156022. 6, dated Jul. 5, 2024, 7 pages.

* cited by examiner

*Primary Examiner* — Kelly M Gambetta
(74) *Attorney, Agent, or Firm* — Kinney & Lange, P.A.

(57) ABSTRACT

A method of forming a ceramic matrix composite includes arranging a plurality of fibers into a preform, each of the plurality of fibers being formed from silicon carbide, depositing a nucleating layer on the plurality of fibers, the nucleating layer comprising a crystalline material having an a-lattice constant and a c-lattice constant, and depositing a boron nitride layer on the nucleating layer. The c-lattice constant of the crystalline material of the nucleating layer corresponds to an a-lattice constant of the silicon carbide, such that the c-lattice constant of the crystalline material is within 3.0% of the a-lattice constant of the silicon carbide.

18 Claims, 2 Drawing Sheets

ATOMIC LAYER DEPOSITION METHOD ENHANCING THE NUCLEATION AND CRYSTALLINITY OF A BORON NITRIDE INTERFACE COATING ON A SILICON CARBIDE FIBER

BACKGROUND

The present invention relates to ceramic matrix composites, and more particularly to the formation of fiber-matrix interface coatings therein.

Fiber-reinforced ceramic matrix composites (CMCs) are known and used for components that are exposed to high temperatures and corrosive conditions that can degrade other kinds of materials. Under such severe conditions, such as the operating conditions in aerospace and aircraft applications, even such ceramic materials are vulnerable to degradation. Over time, ceramic composite materials can form microcracks that further expose the ceramic material to oxygen or other corrosive elements, which form undesirable phases to the detriment of the properties of the ceramic matrix composite component.

Fibers can be coated with a layer of boron nitride (BN) to form a weak interface between the fibers and matrix material to enable desired composite characteristics. However, BN can sometimes form with a disordered structure that readily oxidizes and can lead to diminished capacity for arresting and deflecting cracks. Therefore, composites based on such interfaces can lack sufficient durability and/or fracture toughness. Interface materials with a greater oxidation resistance are therefore desirable.

SUMMARY

A method of forming a ceramic matrix composite includes arranging a plurality of fibers into a preform, each of the plurality of fibers being formed from silicon carbide, depositing a nucleating layer on the plurality of fibers, the nucleating layer comprising a crystalline material having an a-lattice constant and a c-lattice constant, and depositing a boron nitride layer on the nucleating layer. The c-lattice constant of the crystalline material of the nucleating layer corresponds to an a-lattice constant of the silicon carbide, such that the c-lattice constant of the crystalline material is within 3.0% of the a-lattice constant of the silicon carbide.

A method of forming a ceramic matrix composite includes arranging a plurality of fibers into a preform, each of the plurality of fibers being formed from silicon carbide, depositing a nucleating layer on the plurality of fibers, the nucleating layer comprising a crystalline material having an a-lattice constant and a c-lattice constant, and depositing a boron nitride layer on the nucleating layer. The a-lattice constant of the crystalline material of the nucleating layer corresponds to an a-lattice constant of each of the hexagonal boron nitride and turbostratic boron nitride, such that the a-lattice constant of the crystalline material is within 8.0% of the a-lattice constant of each of the hexagonal boron nitride and turbostratic boron nitride.

Figure 1:
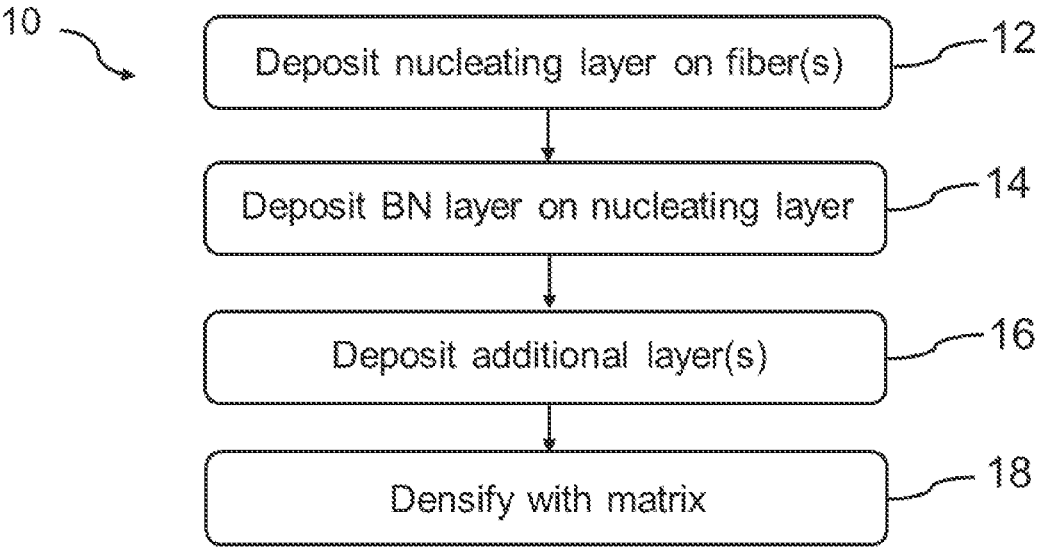
FIG. 1 is a flowchart illustrating a method of forming a CMC with an interface coating including an amount of crystalline BN.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

This disclosure presents a CMC component with a highly crystalline BN interface coating (IFC) layer and a method of forming such a component. A nucleating layer can be deposited, via atomic layer deposition (ALD) on the silicon carbide (SiC) fibers of a preform to promote the formation of more ordered and aligned forms of BN within the IFC. The ordered BN imparts improved fracture toughness and oxidation resistance to the CMC component which can be, for example, incorporated into a gas turbine engine.

Figure 2:
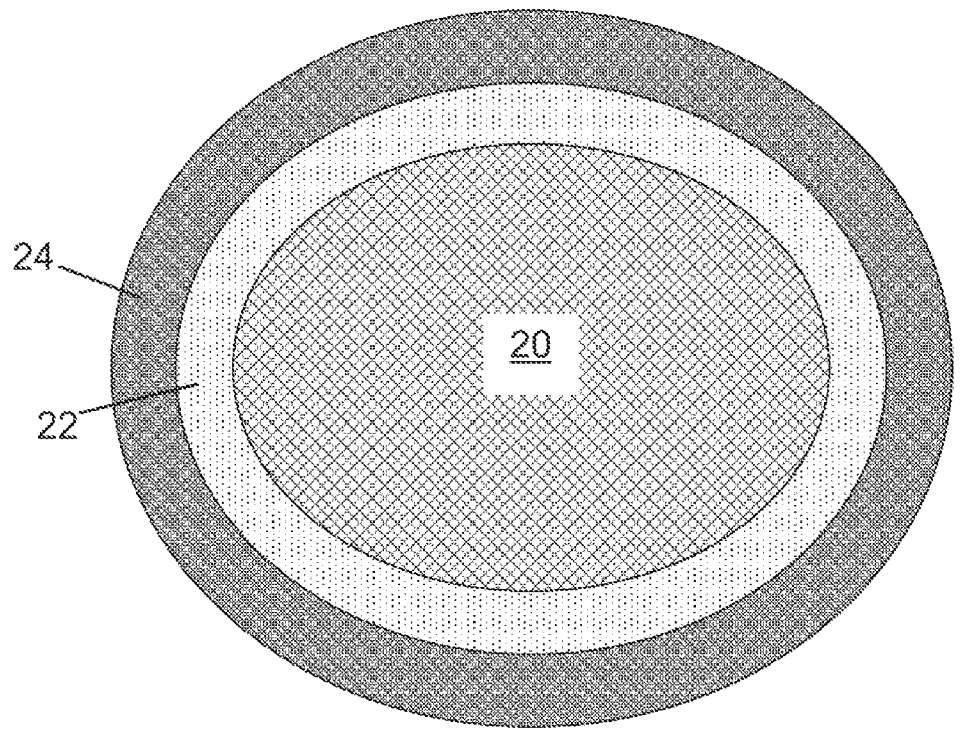
FIG. 2 is a simplified cross-sectional illustration of a fiber coated with a nucleating layer and a BN layer.

FIG. 1 is a method flowchart illustrating select steps of method 10 for fabricating a CMC which includes crystalline BN layer 24. FIG. 2 is a simplified cross-sectional view of fiber 20 coated with nucleating and BN layers 22 and 24, respectively. Method 10 is discussed together with FIGS. 1 and 2.

At step 12, nucleating layer 22 can be deposited on a preform of multiple fibers 20. Nucleating layer 22 can be deposited to generally circumscribe each fiber 20 although discontinuities may exist. Each fiber 20 can be formed from SiC. Fibers 20 can be arranged in one of various two or three-dimensional woven architectures such as plain, harness (e.g., 3, 5, 8, etc.), twill, braid, tape layup, or non-symmetric to name a few non-limiting examples. Non-woven architectures (e.g., chopped, felted, etc.) are also contemplated herein. In an exemplary embodiment, fibers 20 can be formed from the 3C polytype of SiC (i.e., 3C-SiC), also referred to as P-SiC, which has an a-lattice constant of about 4.4 Å ($4.4 \times 10^{-10}$ m).

Nucleating layer 22 can include ruthenium (Ru) deposited via ALD using an Ru-based precursor with, for example, oxygen ($O_2$) at a temperature ranging from about 300° C. to 400° C. The resulting layer can have a generally uniform thickness ranging from 2.0 nm to 20 nm, and more specifically in some embodiments, from 5.0 nm to 10 nm. ALD deposits can typically easily penetrate preforms (e.g., preform 20) of various (e.g., chopped, woven, etc.) fiber architectures. Using ALD, Ru can deposit in a hexagonal closed pack (HCP) crystalline form with an a-lattice constant of about 2.7 Å ($2.7 \times 10^{-10}$ m) and a c-lattice constant of about 4.3 Å ($4.3 \times 10^{-1}$ m). Thus, there is a high degree of lattice match between the a-lattice of the underlying β-SiC (4.4 Å) and the c-lattice of Ru (4.3 Å). Stated another way, the c-lattice constant of Ru is generally within 3.0% of a-lattice constant of β-SiC (i.e., based on 4.3 Å÷4.4 Å). Accordingly, a more cohesive boundary layer between fiber 20 and nucleating layer 22 can form. Alternative embodiments can instead deposit pyrolytic carbon as a nucleating material.

At step 14, BN layer 24 can be deposited on the surface of nucleating layer 22 (opposite fiber 20) via chemical vapor infiltration (CVI). BN layer 24 can be deposited to generally circumscribe nucleating layer 22 of each fiber 20, although discontinuities may exist. Ordered forms of BN, such as hexagonal BN (h-BN) and quasi-ordered turbostratic BN (t-BN) are preferred. The former in particular includes basal planes of covalently bonded B and N atoms aligned with the fiber axis. In an operational environment of a gas turbine engine, such nanostructure facilitates matrix sliding, relative to fiber 20, within BN layer 24, and debonding of BN layer 24 to protect fiber 20. Thus, h-BN is desirable within BN layer 24. The presence of nucleating layer 22 promotes epitaxial growth of h-BN with t-BN under typical CVI process conditions. Such conditions tend not to favor h-BN without significantly elevating the process temperature, which can, undesirably, make deposition of BN hard to control. Each of h-BN and t-BN have a-lattice constants of about 2.5 Å ($2.5\times10^{-10}$ m) such that the a-lattice constants of h-BN and/or t-BN are generally within 8.0% of the a-lattice constant of Ru. Accordingly, there is a high degree of lattice match between the a-lattice of h-BN and/or t-BN with the a-lattice of Ru within nucleating layer 22. In some cases, the a-lattice constant of h-BN in particular can range from 2.5 Å to 2.9 Å ($2.5\times10^{-10}$ to $2.9\times10^{-10}$) such that the a-lattice constant of h-BN is within about 7.0% to 9.0% of the a-lattice constant of Ru.

In contrast, traditional coating schemes may directly apply BN layer 24 to fiber 20, with there being a relatively high degree of lattice mismatch between the a-lattice constant of β-SiC (4.4 Å) and the a-lattice constants of h-BN and t-BN. This can cause crystals of h-BN and/or t-BN to deform upon initial deposit leading to an amount of non-crystalline, amorphous BN (a-BN), which is more susceptible to oxidation and reactivity with water vapor at engine operating temperatures than crystalline forms of BN. Providing nucleating layer 22 according to the present method creates an adaptive bridge between fiber 20 and BN layer 24, as Ru has lattice constants corresponding to each of β-SiC and h-BN/t-BN.

Step 16 can be an optional step for applying, using CVI, additional layers over BN layer 24, such as silicon-doped BN (Si-BN), silicon nitride ($Si_3N_4$), carbon (C), SiC, and/or an additional BN layer, to name a few, non-limiting examples.

At step 18, the preform can be densified with a ceramic (e.g., SiC) matrix that infiltrates the preform of fibers 20 with any encompassing layers. Step 18 can immediately follow step 14 if no further layers, after BN layer 24, are desired. CVI can be used to infiltrate the preform with reactant vapors, and the process can be carried out until the resulting CMC has reached the desired residual porosity. Other techniques for matrix formation are contemplated herein, such as one or a combination of slurry infiltration, melt infiltration, and polymer infiltration and pyrolysis. Such techniques can supplement or precede the CVI process. Protective coatings for the CMC (e.g., thermal barrier coatings, environmental barrier coatings, etc.) can optionally be applied after step 18.

A CMC component formed with the disclosed fiber coating arrangements can be incorporated into aerospace, maritime, or industrial equipment, to name a few, non-limiting examples.

Discussion of Possible Embodiments

The following are non-exclusive descriptions of possible embodiments of the present invention.

A method of forming a ceramic matrix composite includes arranging a plurality of fibers into a preform, each of the plurality of fibers being formed from silicon carbide, depositing a nucleating layer on the plurality of fibers, the nucleating layer comprising a crystalline material having an a-lattice constant and a c-lattice constant, and depositing a boron nitride layer on the nucleating layer. The c-lattice constant of the crystalline material of the nucleating layer corresponds to an a-lattice constant of the silicon carbide, such that the c-lattice constant of the crystalline material is within 3.0% of the a-lattice constant of the silicon carbide.

The method of the preceding paragraph can optionally include, additionally and/or alternatively, any one or more of the following features, configurations and/or additional components:

In the above method, the boron nitride layer can include an amount of hexagonal boron nitride, the hexagonal boron nitride having an a-lattice constant corresponding to the a-lattice constant of the crystalline material of the nucleating layer, such that the a-lattice constant of hexagonal boron nitride is within 8.0% of the a-lattice constant of the crystalline material.

In any of the above methods, the boron nitride layer can further include an amount of turbostratic boron nitride, the turbostratic boron nitride having an a-lattice constant corresponding to the a-lattice constant of the crystalline material of the nucleating layer, such that the a-lattice constant of turbostratic boron nitride is within 8.0% of the a-lattice constant of the crystalline material.

In any of the above methods, the crystalline material of the nucleating layer can include ruthenium.

In any of the above methods, the a-lattice constant of ruthenium can be 2.7 angstroms, and the c-lattice constant of ruthenium can be 4.3 angstroms.

In any of the above methods, the a-lattice constant of hexagonal boron nitride can range from 2.5 angstroms to 2.9 angstroms.

In any of the above methods, the silicon carbide can be β-silicon carbide.

In any of the above methods, the c-lattice constant of the β-silicon carbide can be 4.4 angstroms.

In any of the above methods, the nucleating layer can be deposited using atomic layer deposition.

In any of the above methods, the boron nitride layer can be deposited using chemical vapor infiltration.

In any of the above methods, the nucleating layer can be deposited such that it has a uniform thickness ranging from 2 nanometers to 20 nanometers.

In any of the above methods, the thickness can range from 5 nanometers to 10 nanometers.

Any of the above methods can further include densifying the preform with a ceramic matrix.

In any of the above methods, densifying the preform can include at least one of: chemical vapor infiltration, slurry infiltration, melt infiltration, and polymer infiltration and pyrolysis.

Any of the above methods can further include, prior to the step of densifying the preform, depositing a further layer on the boron nitride layer comprising at least one of: silicon-doped boron nitride, silicon nitride, carbon, silicon carbide, and boron nitride.

A method of forming a ceramic matrix composite includes arranging a plurality of fibers into a preform, each of the plurality of fibers being formed from silicon carbide, depositing a nucleating layer on the plurality of fibers, the nucleating layer comprising a crystalline material having an a-lattice constant and a c-lattice constant, and depositing a boron nitride layer on the nucleating layer. The a-lattice constant of the crystalline material of the nucleating layer corresponds to an a-lattice constant of each of the hexagonal boron nitride and turbostratic boron nitride, such that the a-lattice constant of the crystalline material is within 8.0% of the a-lattice constant of each of the hexagonal boron nitride and turbostratic boron nitride.

The method of the preceding paragraph can optionally include, additionally and/or alternatively, any one or more of the following features, configurations and/or additional components:

In the above method, the c-lattice constant of the crystalline material of the nucleating layer can correspond to an a-lattice constant of the silicon carbide, such that the c-lattice constant of the crystalline material is within 3.0% of the a-lattice constant of the silicon carbide.

In any of the above methods, the silicon carbide can be β-silicon carbide.

In any of the above methods, the crystalline material of the nucleating layer can include ruthenium.

Any of the above methods can further include densifying the preform with a ceramic matrix.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of forming a ceramic matrix composite, the method comprising:

arranging a plurality of fibers into a preform, each of the plurality of fibers being formed from silicon carbide;

depositing a nucleating layer on the plurality of fibers, the nucleating layer comprising a crystalline material having an a-lattice constant and a c-lattice constant, wherein the crystalline material comprises ruthenium; and depositing a boron nitride layer on the nucleating layer;

wherein the c-lattice constant of the crystalline material of the nucleating layer corresponds to an a-lattice constant of the silicon carbide, such that the c-lattice constant of the crystalline material is within 3.0% of the a-lattice constant of the silicon carbide.

2. The method of claim 1, wherein the boron nitride layer comprises an amount of hexagonal boron nitride, the hexagonal boron nitride having an a-lattice constant corresponding to the a-lattice constant of the crystalline material of the nucleating layer, such that the a-lattice constant of hexagonal boron nitride is within 8.0% of the a-lattice constant of the crystalline material.

3. The method of claim 1, wherein the boron nitride layer further comprises an amount of turbostratic boron nitride, the turbostratic boron nitride having an a-lattice constant corresponding to the a-lattice constant of the crystalline material of the nucleating layer, such that the a-lattice constant of turbostratic boron nitride is within 8.0% of the a-lattice constant of the crystalline material.

4. The method of claim 1, wherein the a-lattice constant of ruthenium is 2.7 angstroms, and wherein the c-lattice constant of ruthenium is 4.3 angstroms.

5. The method of claim 4, wherein the a-lattice constant of hexagonal boron nitride ranges from 2.5 angstroms to 2.9 angstroms.

6. The method of claim 4, wherein the silicon carbide is β-silicon carbide.

7. The method of claim 6, wherein the c-lattice constant of the B-silicon carbide is 4.4 angstroms.

8. The method of claim 2, wherein the nucleating layer is deposited using atomic layer deposition.

9. The method of claim 2, wherein the boron nitride layer is deposited using chemical vapor infiltration.

10. The method of claim 2, wherein the nucleating layer is deposited such that it has a uniform thickness ranging from 2 nanometers to 20 nanometers.

11. The method of claim 10, wherein the thickness ranges from 5 nanometers to 10 nanometers.

12. The method of claim 2 and further comprising: densifying the preform with a ceramic matrix.

13. The method of claim 12, wherein densifying the preform comprises at least one of: chemical vapor infiltration, slurry infiltration, melt infiltration, and polymer infiltration and pyrolysis.

14. The method of claim 12 and further comprising: prior to the step of densifying the preform, depositing a further layer on the boron nitride layer comprising at least one of: silicon-doped boron nitride, silicon nitride, carbon, silicon carbide, and boron nitride.

15. A method of forming a ceramic matrix composite, the method comprising:

arranging a plurality of fibers into a preform, each of the plurality of fibers being formed from silicon carbide;

depositing a nucleating layer on the plurality of fibers, the nucleating layer comprising a crystalline material comprising ruthenium, the crystalline material having an a-lattice constant and a c-lattice constant; and depositing a boron nitride layer on the nucleating layer, the boron nitride comprising hexagonal boron nitride and turbostratic boron nitride;

wherein the a-lattice constant of the crystalline material of the nucleating layer corresponds to an a-lattice constant of each of the hexagonal boron nitride and turbostratic boron nitride, such that the a-lattice constant of the crystalline material is within 8.0% of the a-lattice constant of each of the hexagonal boron nitride and turbostratic boron nitride.

16. The method of claim 15, wherein the c-lattice constant of the crystalline material of the nucleating layer corresponds to an a-lattice constant of the silicon carbide, such that the c-lattice constant of the crystalline material is within 3.0% of the a-lattice constant of the silicon carbide.

17. The method of claim 16, wherein the silicon carbide is β-silicon carbide.

18. The method of claim 15 and further comprising: densifying the preform with a ceramic matrix.

* * * * *